Feb. 7, 1967 D. M. J. COMPTON ET AL 3,302,998

SEMICONDUCTOR COMPOUND CRYSTALS

Filed Aug. 1, 1961

INVENTORS
DINSDALE M. J. COMPTON
VINCENT J. LYONS
PATRICIA J. MC DADE

BY John F. Ohlandt Jr.
ATTORNEY

United States Patent Office 3,302,998
Patented Feb. 7, 1967

3,302,998
SEMICONDUCTOR COMPOUND CRYSTALS

Dinsdale M. J. Compton, Solana Beach, Calif., and Vincent J. Lyons, Mount Kisco, and Patricia J. McDade, Croton-on-Hudson, N.Y., assignors to International Business Machines Corporation, New York, N.Y., a corporation of New York Filed Aug. 1, 1961, Ser. No. 128,558
4 Claims. (Cl. 23—204)

This invention relates to semiconductor crystalline bodies and, more particularly, to those that are constituted of semiconductor compounds, notably, the compounds formed from elements of the third and fifth groups of the periodic table.

The elemental semiconductors such as germanium and silicon have been thoroughly investigated in the past, and many techniques for fabricating crystalline bodies that may be utilized for semiconductor devices have been successfully developed. An entirely new field of semiconductor device fabrication has opened since the discovery of the usefulness of certain compounds as semiconductors, more particularly, those which are known as the III–V compounds. Certain of these III–V compounds and their properties have been intensively investigated, and it is to the synthesis and growth of two of these compounds, namely, gallium phosphide and gallium arsenide, that the present invention is especially directed, although not limited thereto.

In attempting to fabricate III–V compound devices, it is, of course, necessary to develop techniques for producing monocrystalline bodies from which the devices may be formed. Although it might be thought that previously developed techniques for fabricating the elemental semiconductor bodies might by quite readily applied to the formation of crystalline bodies of the III–V compounds, this has not been the case because, first of all, one is dealing with substances composed of at least two elements, and these elements must be kept to strict stoichiometric proportions. Furthermore, detailed and specialized knowledge of the chemistry of the semiconductor compounds must first be attained before successful fabrication can be undertaken. Thus many practical problems are presented because the properties and attributes of the III–V compounds preclude the simple application of well-founded techniques.

With respect to the compound gallium phosphide, this material has a melting point of 1500° C. under a phosphorus pressure exceeding 20 atmospheres. This property requires that highly specialized and costly equipment be employed if the compound is to be synthesized directly from the elements and crystals are to be grown from stoichiometric or nearly stoichiometric melts. Although it has been reported that such specialized equipment has been able to produce monocrystalline gallium phosphide, investigations of more simplified methods are currently being carried on.

The present invention relates to a vapor phase method of low temperature and low pressure synthesis of semiconductor compounds and in particular to the synthesis and crystal growth of gallium phosphide and gallium arsenide from the elemental constituents. The technique of the present invention has as its principal advantage the use of conventional laboratory equipment. Synthesis and crystal growth at the low temperatures of this technique has the additional advantage of a lower probability of contamination of the grown crystal by impurities derived from the container and, further, diffusion coefficients for impurities in the crystal are reduced at lower temperatures.

The present invention envisions in one of its embodiments the disposition of elemental gallium and either arsenic or phosphorus in an evacuated sealed tube in which a small quantity of iodine is vaporized to provide the ambient. The exact reaction mechanisms which govern the synthesis and growth of gallium phosphide and gallium arsenide are not known, but it is thought that the reaction consists of the formation of two gallium iodides at the gallium site. The proportion of the two iodides is a function of total pressure and temperature such that at the higher temperature of the gallium site, there will be a higher proportion of the lower valence iodide. At the lower temperature the proportions change so as to produce, in the presence of phosphorus or arsenic, a higher proportion of the higher valence iodide and gallium phosphide (or gallium arsenide).

Accordingly it is an object of the present invention to enable the production of monocrystalline semiconductor bodies at low temperatures and low pressures.

Another object is to provide a technique for obtaining highly pure and perfect crystals of the semiconductor compounds.

Another object is to provide the growth of the semiconductor compound gallium phosphide.

Another object is to provide for the growth of gallium arsenide.

The foregoing and other objects, features and advantages of the invention will be apparent from the following more particular description of preferred embodiments of the invention, as illustrated in the accompanying drawings.

Figure 1:
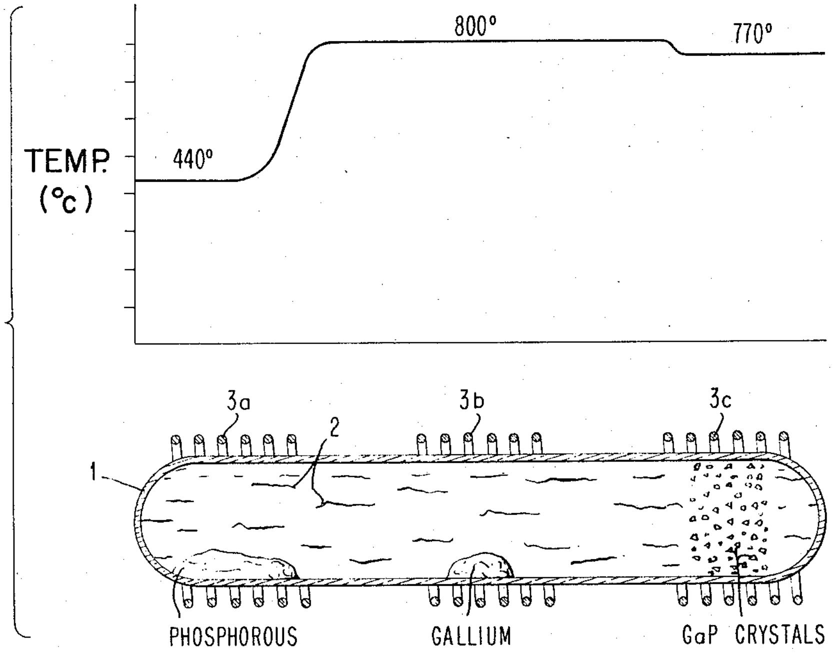
FIG. 1 illustrates the apparatus used to produce gallium phosphide crystals.

Referring now to FIG. 1, there is illustrated a reaction container 1, which in this particular example is shown as a closed tube made of quartz or similar material, wherein a quantity of iodine 2 has been introduced so as to provide an iodine pressure of approximately 1 atmosphere. The iodine may be produced in the gaseous phase by suitably introducing a small quantity of iodine in the solid form and vaporizing it as the temperature of the tube is increased. The tube 1 is sealed after evacuation of air in accordance with standard practice. Around the tube are disposed heater coils, **3*a*, 3*b* and 3*c***, connected to a source of power not shown, for providing the requisite temperature in selected zones. Inside the tube at the left, there is situated a quantity of phosphorus maintained at a temperature sufficient to provide a pressure of 1.2 to 3 atmospheres. The temperature profile above the reaction container depicts the temperature condition for the phosphorus as well as for the other materials disposed along the length of the tube. As indicated by the figure, the gallium is maintained at 800° C. and the deposition zone where the gallium phosphide crystals form is maintained at approximately 770° C. As previously stated, although the reaction mechanisms are not now known, the following description is provided.

The iodine, which has been introduced into the container, reacts with the gallium to form gallium iodides. The phosphorus, because of the temperature that is employed, will go into its gaseous state and will subsequently react with the gallium that is formed in the lowered temperature zone to provide the synthesis and crystal growth of gallium phosphide shown at the right of the tube.

In an experimental run, following the teaching of the present invention, .2 g. of iodine was used as well as 1.7 g. of phosphorus and 3 g. of gallium. The gallium phosphide crystals which were deposited were about 1 to 2 mm. in size. However, a single crystal seed may be introduced in the deposition zone and thus a large crystal growth may be obtained by virtue of epitaxial deposition onto the crystal seed.

It will be obvious that the reaction heretofore described can proceed over a range of iodine and phosphorus pressures and reaction temperatures. Other changes, such as reaction-tube geometry and position, will influence the kinetics of the reaction.

Figure 2:
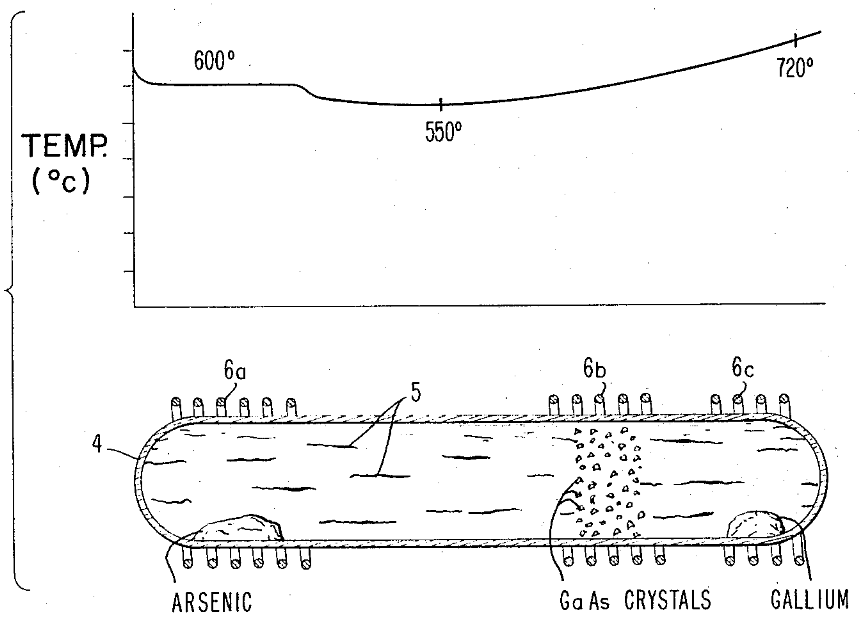
FIG. 2 illustrates the apparatus for producing gallium arsenide.

Referring now to FIG. 2, an apparatus, similar to that previously depicted in FIG. 1 for the growth of gallium phosphide, is shown for the growth of gallium arsenide crystals. The particular temperature profile has been varied somewhat from that shown in FIG. 1. The quantity of gallium is disposed on the right end of tube 4 and the arsenic on the extreme left. However, the basic reactions that take place are analogous to those that were postulated for the scheme of FIG. 1. As in FIG. 1, the iodine vapor is created and is designated by numeral 5. A plurality of heater coils, *6a*, *6b* and *6c*, are provided for the requisite temperature gradient.

A typical arrangement for the scheme of FIG. 2 involves the use of 3 g. of gallium, 1 g. of arsenic and 200 mg. of iodine in a 100 cc. tube. The synthesis and growth of gallium arsenide crystals was carried on for two days after which time the tube 4 was opened. It was found that gallium arsenide had grown at a region toward the middle of the tube as indicated in FIG. 2.

Although the technique of the present invention has been limited in experiments to growth of gallium phosphide and gallium arsenide, it will be apparent to skilled workers in the art that other semiconductor compounds can be similarly synthesized. It will also be apparent that rather than the closed-tube schemes, which have been illustrated in the embodiments of FIG. 1 and FIG. 2, the dynamic flow or open tube system may be employed. In the dynamic flow system, the reaction container is left open and a flow of carrier gas is introduced into the container so as to sweep the reaction products from one zone to another.

What has been disclosed is a novel technique for the synthesis and growing of semiconductor compound crystals. With this technique, expensive and complicated equipment need not be employed since there is envisioned the use of the elemental constituents, advantageously disposed in a container with a halide reactive ambient. Thus the process is far simpler than what has heretofore been the practice. Furthermore, the ability to start with elemental constituents means that very pure and readily available materials can be used. The semiconductor compound crystals that have been formed by the technique of the present invention have been found on examination to be highly pure and possess a high degree of crystallographic perfection, attributable to the fact that the technique prevents introduction of contaminants into grown crystals due to the low temperatures that are used.

While the invention has been particularly shown and described with reference to preferred embodiments thereof, it will be understood by those skilled in the art that various changes in form and details may be made therein without departing from the spirit and scope of the invention.

What is claimed is:

1. A method of synthesizing semiconductor compound crystals comprising the steps of introducing a halogen into a reaction container having first, second and third temperature zones, positioning in the first zone one element of the compound to be synthesized, which element is reactive with said halogen to form a mixture of different valence halides, positioning in the second zone a second element of the compound, providing a temperature gradient in said reaction container such that said first zone is at a higher temperature than said second and third zones and such that at said third zone the ratio of the two halides changes so as to provide the first element, and said second element reacts with said first element to form crystals of said semiconductor compound.

2. A method as described in claim 1 wherein said halogen is iodine.

3. A method of synthesizing gallium phosphide comprising the steps of introducing a halogen into a reaction container, positioning in one temperature zone of said reaction container a quantity of gallium which is reactive with said halogen to form a mixture of gallium halides, positioning in said second temperature zone in said container a quantity of phosphorus, providing a temperature gradient in said container such that the ratio of the halides changes so as to provide gallium and the phosphorus reacts with said gallium to form crystals of gallium phosphide.

4. A method of synthesizing gallium arsenide comprising the steps of introducing a halogen into a reaction container, positioning in one temperature zone of said reaction container, a quantity of galium which is reactive with said halogen to form a mixture of gallium halides, positioning in said second temperature zone in said container a quantity of arsenic, providing a temperature gradient in said container such that the ratio of the halides changes so as to provide gallium and the arensic reacts with said gallium to form crystals of gallium arsenide.

References Cited by the Examiner

UNITED STATES PATENTS

| | | | |
|---|---|---|---|
| 2,871,100 | 1/1959 | Guire et al. | 23—204 |
| 2,984,577 | 5/1961 | Williams | 23—204 |
| 3,094,387 | 6/1963 | Williams | 23—204 |

FOREIGN PATENTS

| | | |
|---|---|---|
| 606,308 | 10/1960 | Canada. |
| 1,109,655 | 6/1961 | Germany. |

OSCAR R. VERTIZ, *Primary Examiner.*

MAURICE A. BRINDISI, *Examiner.*

M. N. MELLER, H. S. MILLER, *Assistant Examiners.*